United States Patent
Smith et al.

(10) Patent No.: US 6,455,400 B1
(45) Date of Patent: *Sep. 24, 2002

(54) SEMICONDUCTOR PROCESSING METHODS OF FORMING SILICON LAYERS

(75) Inventors: Keith Smith; Phillip G. Wald, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/596,237

(22) Filed: Jun. 13, 2000

Related U.S. Application Data

(63) Continuation of application No. 09/146,732, filed on Sep. 3, 1998, now Pat. No. 6,096,626.

(51) Int. Cl.⁷ .............................................. H01L 21/20
(52) U.S. Cl. ............................................................ 438/482
(58) Field of Search ................................ 438/478, 482, 438/488, 398, 255, 286, 249, 561, 246, 243, 239, 564, 407, FOR 261, FOR 269

(56) References Cited

U.S. PATENT DOCUMENTS

| | | | |
|---|---|---|---|
| 4,742,020 A | * | 5/1988 | Roy |
| 4,829,024 A | | 5/1989 | Klein et al. |
| 4,833,519 A | | 5/1989 | Kawano et al. |
| 5,583,070 A | | 12/1996 | Liao et al. |
| 5,597,754 A | | 1/1997 | Lou et al. |
| 5,618,747 A | | 4/1997 | Lou |
| 5,691,228 A | | 11/1997 | Ping et al. |
| 5,691,249 A | | 11/1997 | Watanabe et al. |
| 5,693,557 A | * | 12/1997 | Hirao et al. |
| 5,714,795 A | | 2/1998 | Ohmi et al. |
| 5,763,306 A | | 6/1998 | Tsai |
| 5,801,087 A | | 9/1998 | Manning et al. |
| 5,801,427 A | | 9/1998 | Shiratake et al. |
| 5,825,068 A | | 10/1998 | Yang |
| 5,840,605 A | | 11/1998 | Tuan |
| 5,856,007 A | | 1/1999 | Sharan et al. |
| 5,869,389 A | | 2/1999 | Ping et al. |
| 5,874,333 A | | 2/1999 | Chang et al. |
| 5,893,747 A | | 4/1999 | Yang |
| 5,913,125 A | | 6/1999 | Brouillette et al. |
| 6,015,743 A | | 1/2000 | Zahurak et al. |

* cited by examiner

Primary Examiner—Savitri Mulpuri
(74) Attorney, Agent, or Firm—Wells St. John P.S.

(57) ABSTRACT

In one aspect, the invention includes a semiconductor processing method comprising depositing a silicon layer over a substrate at different deposition temperatures which at least include increasing the deposition temperature through a range of from about 550° C. to about 560° C. In another aspect, the invention includes a semiconductor processing method comprising, in an uninterrupted deposition process, depositing a silicon layer which comprises an essentially amorphous silicon region, an essentially polycrystalline silicon region, and a transition region interconnecting the essentially amorphous silicon region and the essentially polycrystalline silicon region, the essentially amorphous silicon region having an amorphous silicon content which is greater than or equal to about 90 weight percent of a total material of the amorphous silicon region, the essentially polycrystalline silicon region having a polycrystalline silicon content which is greater than or equal to about 90 weight percent of a total material of the polycrystalline silicon region, the transition comprising an amorphous silicon content and a polycrystalline silicon content, the transition region being defined as a region having both a lower amorphous silicon content than the essentially amorphous silicon region and a lower polycrystalline silicon content than the essentially polycrystalline silicon region, the transition region being at least 45 Angstroms thick.

9 Claims, 3 Drawing Sheets

US 6,455,400 B1

SEMICONDUCTOR PROCESSING METHODS OF FORMING SILICON LAYERS

RELATED PATENT DATA

This patent resulted from a continuation application of U.S. patent application Ser. No. 09/146,732, which was filed on Sep. 3, 1998 Now U.S. Pat. No. 6,096,626.

TECHNICAL FIELD

The invention pertains to semiconductor structures comprising silicon layers, as well as to semiconductor processing methods of forming silicon layers.

BACKGROUND OF THE INVENTION

Silicon layers are a common constituent of semiconductor devices. Silicon layers can be utilized, for example, as interconnecting lines in integrated circuits, or as constituents of integrated circuit electrical components. Silicon layers are typically formed by chemical vapor deposition processes utilizing silane. Such processes can also utilize a dopant gas when it is desired to form an in situ doped silicon layer. Silicon layers can be deposited to comprise either essentially amorphous silicon, or essentially polycrystalline silicon. Essentially amorphous silicon is formed by depositing silicon at temperatures below 550° C., while polysilicon is formed by depositing silicon at temperatures above 575° C.

Generally, the essentially amorphous silicon is not 100% in an amorphous form, but rather comprises a small percentage of polycrystalline silicon. Also, the essentially polycrystalline silicon is not 100% in a polycrystalline form, but also comprises a small percentage of amorphous silicon. For purposes of interpreting this disclosure and the claims that follow, essentially amorphous silicon is defined as silicon which is 90 weight percent or more in an amorphous form, and essentially polycrystalline silicon is defined as silicon which is 90 weight percent or more in a polycrystalline form.

Frequently during semiconductor device fabrication, a layer of essentially polycrystalline silicon or essentially amorphous silicon is formed directly over and in contact with a different form of silicon. Such different form of silicon can comprise essentially amorphous silicon, essentially polycrystalline silicon, or monocrystalline silicon such as the silicon of a semiconductor wafer substrate. When a layer of essentially amorphous silicon or essentially polycrystalline silicon is formed over and in contact with a layer of a different type of silicon, a stress can occur between the layers. Such stress is undesired as it can lead to device failure in semiconductor circuits. Accordingly, it is desirable to develop alternate semiconductor fabrication methods which reduce stress between different silicon layers.

In another aspect of semiconductor processing, it is frequently desirable to create a dopant gradient within a semiconductive material. For instance, some fuses and resistors formed in monolithic integrated circuits preferably comprise a dopant gradient. It would be desirable to develop methods for providing dopant gradients in semiconductive materials.

SUMMARY OF THE INVENTION

In one aspect, the invention encompasses a semiconductor processing method wherein a silicon layer is deposited over a substrate at different deposition temperatures which at least include increasing the deposition temperature through a range of from about 550° C. to about 560° C.

In another aspect, the invention encompasses a semiconductor processing method wherein a dopant gradient is formed in situ within a doped silicon layer during formation of the silicon layer in an uninterrupted deposition process. The uninterrupted deposition process includes, during the in situ doping, varying a temperature at which the doped silicon is formed.

In yet another aspect, the invention encompasses a semiconductor structure. The structure includes a silicon layer over a substrate. The silicon layer has a silicon inner portion, a silicon outer portion and a silicon transition region intermediate the silicon inner and outer portions. One of the inner and outer portions is essentially polycrystalline. The other of the inner and outer portions is essentially amorphous. The silicon transition region is neither essentially amorphous nor essentially polycrystalline and constitutes at least 1% of a thickness of the silicon layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
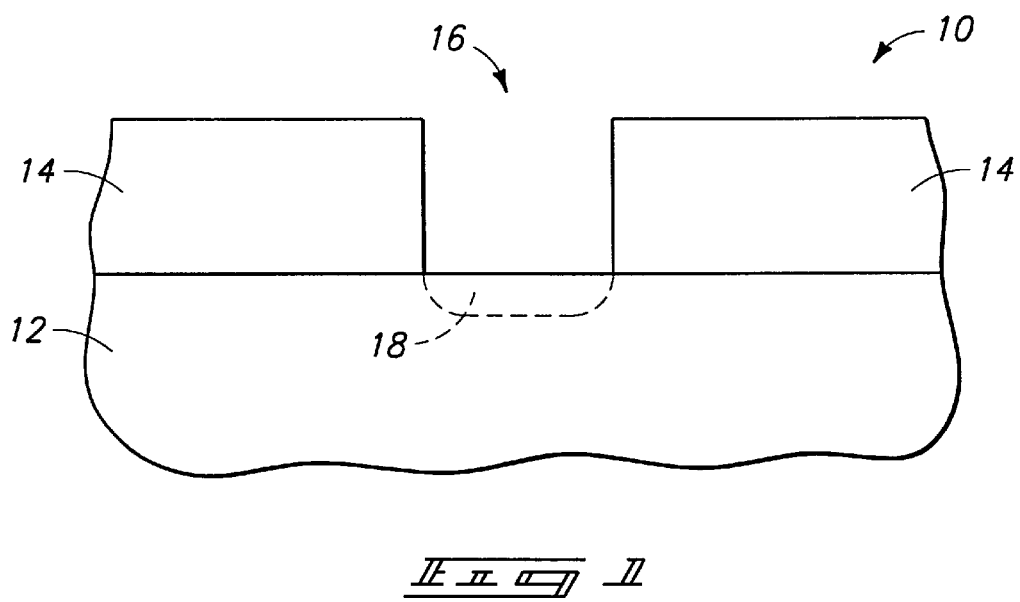
FIG. 1 is a diagrammatic, cross-sectional view of a semiconductor wafer fragment at a preliminary processing step of a method of the present invention.

A first embodiment method of the present invention is described with reference to FIGS. 1–3. Referring to FIG. 1, a semiconductor wafer fragment 10 is shown at a preliminary processing step. Wafer fragment 10 comprises a substrate 12 over which is formed a layer 14. Substrate 12 can comprise, for example, a monocrystalline silicon wafer lightly doped with a conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Layer 14 can comprise, for example, an insulative material such as borophosphosilicate glass (BPSG). An opening 16 is etched through layer 14 to expose an upper surface of substrate 12. Methods for etching opening 16 are known to persons of ordinary skill in the art. A node location 18 is defined within substrate 12 at a base of opening 16. Node location 18 can comprise, for example, a diffusion region comprising a relatively large concentration of conductivity-enhancing dopant. If node location 18 is a diffusion region, it can be conductively doped at the preliminary step shown in FIG. 1, or it can be conductively doped at a later processing step. For instance, a conductively doped diffusion region can be formed at node location 18 by implanting a conductivity-enhancing dopant into opening 16.

Figure 2:
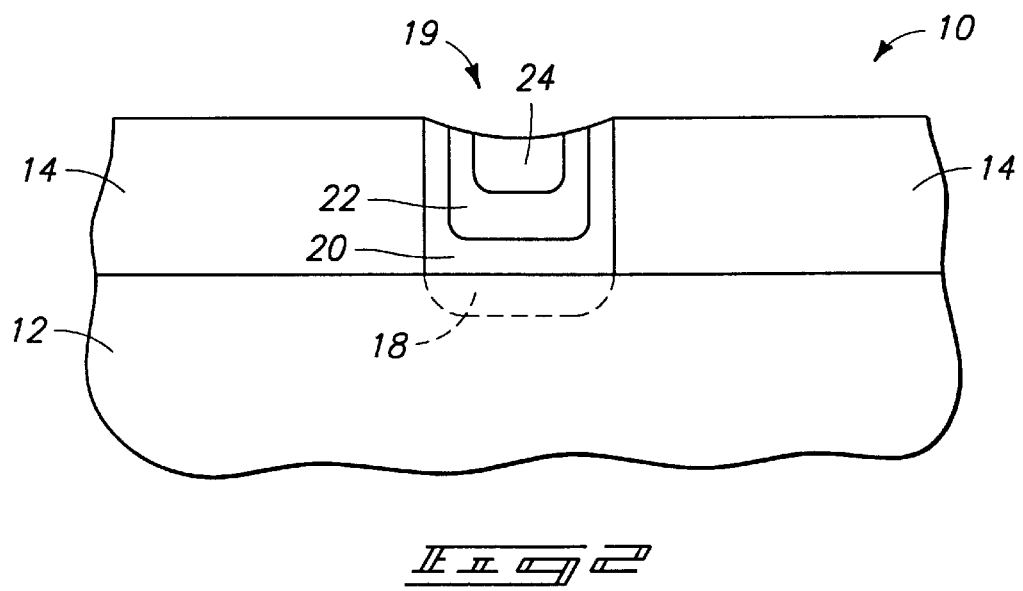
FIG. 2 is a view of the FIG. 1 wafer fragment at a processing step subsequent to that of FIG. 1.

Referring to FIG. 2, a silicon layer 19 is provided within opening 16 (shown in FIG. 1). Silicon layer 19 comprises three distinct regions in the form of a first region 20, a second region 22, and a third region 24. First region 20 comprises an inner portion of silicon layer 19 and third region 24 comprises an outer portion of silicon layer 19. One of regions 20 and 24 is essentially amorphous silicon and the other is essentially polycrystalline silicon. Region 22 is a transition region between regions 20 and 24, and is neither essentially amorphous silicon nor essentially polycrystalline silicon.

Silicon layer 19 has a thickness, and transition region 22 preferably constitutes at least 1% of such thickness. More preferably, region 22 comprises from about 10% to about 20% of the thickness of silicon layer 19. In preferred embodiments, region 22 can be at least 45 Angstroms thick and comprise at least 1% of the thickness of layer 19. The preferred thickness of transition region 22 is found to significantly reduce stress between the essentially amorphous and essentially polycrystalline regions that sandwich region 22.

Silicon layer 19 is preferably formed in an uninterrupted deposition process. For purposes of interpreting this disclosure and the claims that follow, an uninterrupted deposition process is defined as a deposition process which occurs entirely in a single processing chamber, and without stopping the deposition process at any point between the initial formation of lowermost portion 20 and the final formation of outermost portion 24 of silicon layer 19.

In the shown embodiment, silicon layer 19 is provided only within opening 16, and not over layer 14. Such embodiment can be formed, for example, by selectively depositing layer 19 within opening 16. For instance, if substrate 12 is a monocrystalline silicon wafer and layer 14 is an insulative material, such as, for example, BPSG, silicon layer 19 can be selectively deposited within opening 16 (shown in FIG. 1) by adjusting a deposition pressure. Methods of selectively depositing a silicon layer onto a silicon wafer and not onto an insulative material are known to persons of ordinary skill in the art. Another example method of providing silicon layer 19 only within opening 16 comprises first depositing silicon layer 19 both within opening 16 and over layer 14. Next, layer 19 is patterned to leave only a portion of silicon layer 19 within opening 16 remaining.

Preferred deposition processes of the present invention include depositing silicon at temperatures which vary from below or equal to about 550° C. to above or equal to about 560° C. More preferably, the deposition processes include varying temperatures through a range of from about 530° C. to about 600° C. The temperature can be either increased, or decreased within the above-described ranges depending on whether it is desired to form a polycrystalline outer portion 24 and an amorphous inner portion 20, or vice versa. The temperature will preferably be varied at a rate of from about 0.50° C. per minute to about 80° C. per minute. The temperature can be varied at a substantially constant rate to provide an intermediate portion 22 having a substantially uniform gradient of change from the silicon type of inner portion 20 to the silicon type of outer portion 24.

In an example process wherein region 20 is an essentially amorphous silicon region and region 24 is an essentially polycrystalline silicon, the formation of silicon layer 19 is as follows. First, wafer 10 is provided within a processing chamber together with silicon precursor materials. The silicon precursor materials can include, for example, $SiH_4$, for a chemical vapor deposition (CVD) process. After provision of wafer 10 and the precursor materials in the processing chamber, deposition of layer 20 starts at a low temperature below or equal to about 550° C., and at a pressure of from about 200 mTorr to about 700 mTorr. The pressure is maintained in the specified range during the remainder of the following deposition process. The temperature is maintained substantially constant until all of layer 20 is deposited. Subsequently, and while continuing to deposit silicon, the temperature within the processing chamber is ramped to a high temperature above or equal to about 575° C. During the ramping of the temperature, intermediate portion 22 is formed. The temperature within the processing chamber is then maintained substantially constant at a temperature above 575° C., while also maintaining the deposition of silicon, to form essentially polycrystalline silicon at portion 24.

The above-described processing produces a wide transition region 22 between an essentially amorphous portion 20 and an essentially polycrystalline portion 24 of silicon layer 19. Wide transition region 22 reduces stress between portions 20 and 24 relative to stress which would occur if a narrower transition region were formed.

An advantage in forming the essentially amorphous silicon portion of silicon layer 19 against a monocrystalline silicon substrate is to reduce stress between the monocrystalline silicon substrate and an overlying silicon layer. There is less stress between a monocrystalline silicon layer and an adjacent essentially amorphous silicon layer, than between a monocrystalline silicon layer and an adjacent essentially polycrystalline silicon layer. It is desirable to form a layer of essentially polycrystalline silicon over the layer of essentially amorphous silicon, rather than to form an entirety of silicon layer 19 from essentially amorphous silicon, because gross deposition times may be reduced. This is a desirable enhancement for high volume production.

An alternative processing method of the present invention can produce a silicon layer 19 having an essentially polycrystalline silicon lower portion 20, an essentially amorphous silicon upper portion 24, and a transition region 22 between such portions. To form such layer 19, the above-described processing is reversed such that initial processing occurs at above or equal to about 575° C. to form lower portion 20, and final processing occurs at below or equal to about 550° C. to form upper portion 24.

An advantage in forming a polycrystalline silicon layer first and an amorphous silicon layer overlying the polycrystalline silicon can be to vary deposition rate during formation of silicon layer 19. Specifically, deposition rate is impacted by temperature, pressure and an amount of dopant gases in a feed stream. Under conditions of constant pressure and constant gas feed, a higher temperature will produce a higher deposition rate. In some applications it is advantageous to use a high temperature to get a very quick initial deposition rate and to then lower the deposition rate at a conclusion of forming a silicon layer 19 to get an amorphous top layer 24. An example reason for wanting an amorphous top layer 24 is in applications in which surface sensitive tools are utilized for obtaining particulate counts on a wafer surface. Surface sensitive tools typically work better over the relatively smooth amorphous films rather than the relatively rough polycrystalline silicon films.

Figure 3:
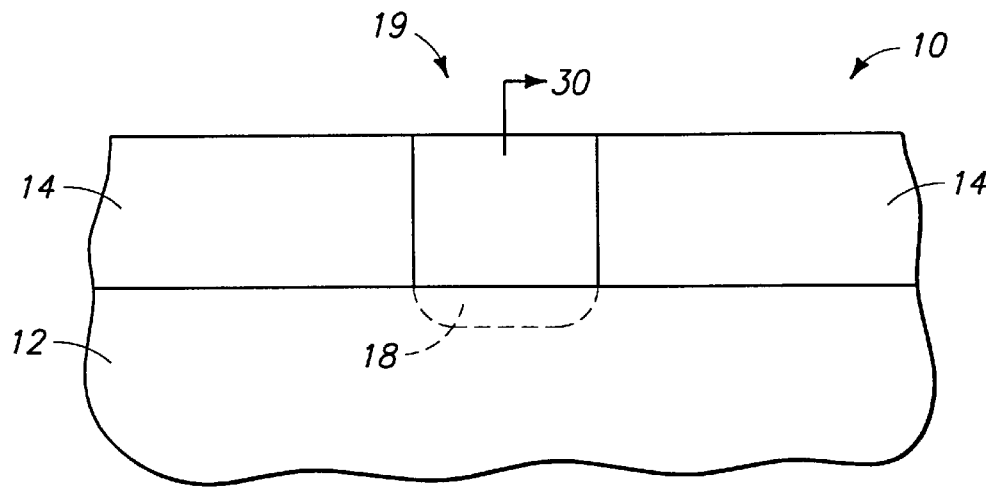
FIG. 3 is a view of the FIG. 1 wafer fragment at a processing step subsequent to that of FIG. 2.

Referring to FIG. 3, wafer 10 is illustrated after silicon layer 19 is exposed to annealing conditions at a temperature greater than 700° C. for a time greater than 60 seconds. Such annealing conditions convert substantially all of the amorphous silicon of silicon layer 19 to polycrystalline silicon.

If layer 19 is to be utilized as an electrical interconnect, layer 19 is preferable doped with a conductivity-enhancing dopant. An example method for doping layer 19 is to provide a dopant precursor during formation of regions 20, 22 and 24 of FIG. 2 to thereby form regions 20, 22 and 24 as in situ doped silicon regions. If the dopant concentration within the processing chamber is maintained at a constant level, the amorphous portions of silicon layer 19 will comprise a higher concentration of dopant than will the polycrystalline portions of layer 19. Accordingly, a dopant concentration within silicon layer 19 will be highest in the essentially amorphous portion of the layer, and then gradually decrease through intermediate portion 22 to become lowest in the essentially polycrystalline portion of layer 19. However, during an anneal at 700° C. or greater to convert amorphous silicon to polycrystalline silicon, the dopant can diffuse through silicon layer 19 until the dopant is substantially uniformly distributed throughout layer 19. Also, such anneal can out-diffuse dopant from silicon layer 19 into node location 18 to form a diffusion region at node location 18.

As will be recognized by persons of ordinary skill in the art, layer 19 can be doped by other methods besides the in situ method described above. Such other methods include, for example, ion implantation.

After conversion of the amorphous silicon to polysilicon, and after suitable doping, silicon layer 19 can be utilized as an electrical interconnect between first node location 18 and a second node location 30.

Figure 4:
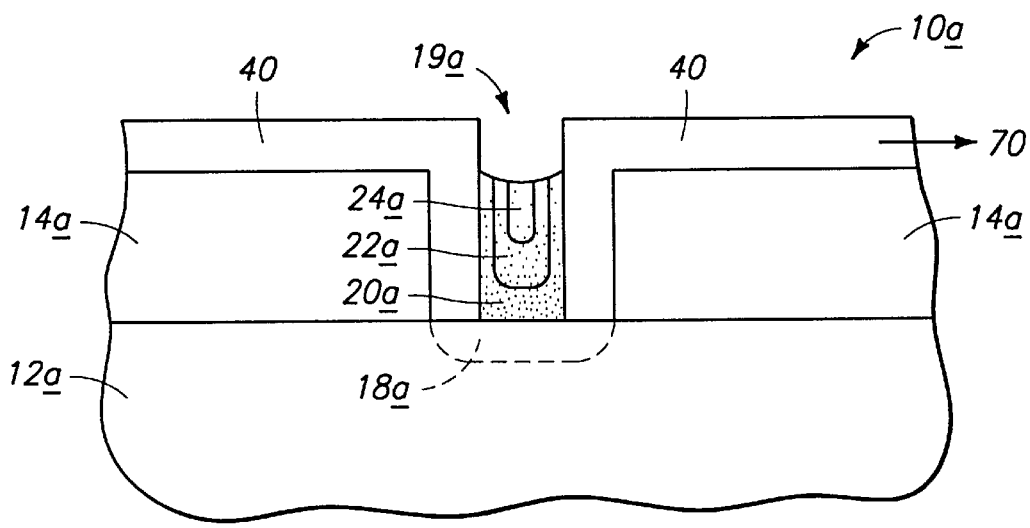
FIG. 4 is a diagrammatic, cross-sectional view of a semiconductor wafer fragment at a processing step in accordance with a second embodiment of the present invention.
Figure 5:
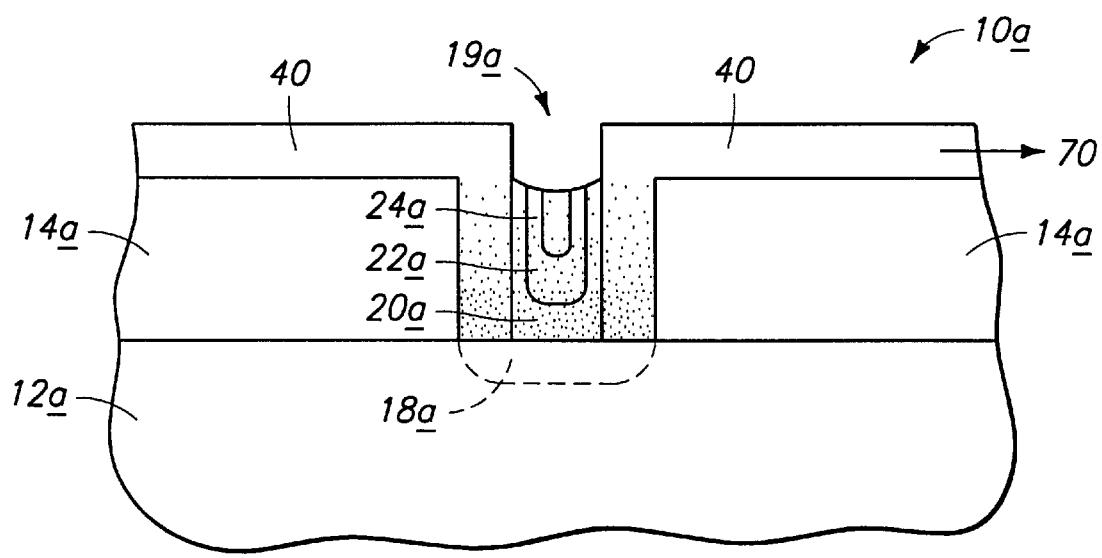
FIG. 5 is a view of the FIG. 4 wafer fragment at a processing step subsequent to that of FIG. 4.

FIGS. 4 and 5 illustrate an alternative embodiment of the present invention wherein a silicon layer of the present invention is utilized to form a dopant gradient in an adjacent layer. In describing the embodiment of FIGS. 4 and 5, similar numbering to that utilized above will be used, with differences indicated by the suffix "a" or by different numerals.

Referring to FIG. 4, a semiconductive wafer 10a is illustrated. Wafer 10a comprises a substrate 12a, and a layer 14a over substrate 12a. Layer 14a can comprise, for example, an electrically insulative material such as BPSG. Wafer 10a in FIG. 4 is shown at a processing step comparable to the processing step at which wafer 10 is shown in FIG. 2. Accordingly, an opening has been formed through layer 14a and a silicon layer 19a has been deposited within such opening. In the shown embodiment, silicon layer 19a comprises an inner portion 20a consisting essentially of amorphous silicon and an outer portion 24a consisting essentially of polycrystalline silicon. In alternative embodiments of the invention, layers 20a and 24a can be interchanged. Silicon layer 19a also comprises an intermediate portion 22a between inner portion 20a and outer portion 24a.

Layers 20a, 22a and 24a are doped with a conductivity enhancing dopant. The dopant concentration is highest within portion 20a and lowest within portion 24a, and comprises concentrations intermediate between the highest concentration and the lowest concentration within intermediate portion 22a.

A layer of material 40 is against silicon layer 19a. Layer 40 preferably comprises a semiconductive material, such as polycrystalline silicon. Layer 40 can be formed by methods known to persons of ordinary skill in the art. Such methods include, for example, forming the material of layer 40 within opening 16 prior to forming silicon layer 19, and subsequently patterning and etching the layer to form the shape of layer 40 in FIG. 4. Then after patterning and etching layer 40, silicon layer 19a is formed within a remaining portion of opening 16 and against layer 40.

Layer 40 extends between node location 18a and a second node location 70. Although in the shown embodiment, layer 40 and layer 19a connect to a common node location 18a, it is to be understood that in other embodiments of the invention layers 40 and 19a can connect to separate node locations.

Referring to FIG. 5, wafer 10a is shown after being exposed to conditions which out-diffuse dopant from silicon layer 19a and into adjacent layer 40. Suitable conditions can include high temperature processing. If the temperatures exceed 700° C., amorphous portions of silicon layer 19a will be converted to polysilicon and dopant can diffuse to a homogeneous concentration through layer 19a. In the shown embodiment, the out-diffusion temperatures have not exceeded 700° C., and the dopant has not diffused to a homogeneous concentration throughout layer 19a.

Out-diffusion of dopant from layer 19a and into adjacent layer 40 has produced a dopant concentration within layer 40 comparable to the concentration gradient which existed within layer 19a. The concentration gradient within layer 40 produces varying resistance throughout the layer.

Layer 40 can subsequently be incorporated into, for example, a resistor or a fuse through additional processing steps which are not shown, but which will be recognized to persons of ordinary skill in the art.

In compliance with the statute, the invention has been described in language more or less specific as to structural and methodical features. It is to be understood, however, that the invention is not limited to the specific features shown and described, since the means is herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising, in an uninterrupted deposition process, depositing silicon at a temperature which is initially a constant low temperature below or equal to about 550° C. and which increases to a constant high temperature above or equal to about 575° C. during the deposition; and wherein the temperature increases to the temperature above or equal to about 575° C. at a rate of from about 0.5° C./minute to about 8° C./minute.

2. A semiconductor processing method comprising, in an uninterrupted deposition process, depositing a silicon layer which comprises an essentially amorphous silicon region, an essentially polycrystalline silicon region, and a transition region interconnecting the essentially amorphous silicon region and the essentially polycrystalline silicon region, the essentially amorphous silicon region having an amorphous silicon content which is greater than or equal to about 90 weight percent of a total material of the amorphous silicon region, the essentially polycrystalline silicon region having a polycrystalline silicon content which is greater than or equal to about 90 weight percent of a total material of the polycrystalline silicon region, the transition region comprising an amorphous silicon content and a polycrystalline silicon content, the transition region being defined as a region having both a lower amorphous silicon content than the essentially amorphous silicon region and a lower polycrystalline silicon content than the essentially polycrystalline silicon region, the transition region being at least 45 Angstroms thick: and wherein the silicon layer is formed within an opening in an insulative material.

3. The semiconductor processing method of claim 2, comprising forming the essentially amorphous silicon region against a monocrystalline silicon substrate.

4. The semiconductor processing method of claim 2 wherein the silicon layer comprises an earliest formed portion and a latest formed portion, and wherein the earliest formed portion is the essentially amorphous silicon region and the latest formed portion is the essentially polycrystalline silicon region.

5. The semiconductor processing method of claim 2 wherein the silicon layer comprises an earliest formed portion and a latest formed portion, and wherein the earliest formed portion is the essentially polycrystalline silicon region and the latest formed portion is the essentially amorphous silicon region.

6. A semiconductor processing method comprising in situ forming a dopant gradient within a doped silicon layer during formation of the silicon layer in an uninterrupted deposition process, the uninterrupted deposition process comprising, during the in situ doping, varying a temperature at which the doped silicon is formed; and wherein the uninterrupted depositing begins at a temperature below or equal to about 550° C. and increases to a temperature above or equal to about 575° C. at a rate of from about 0.5° C./minute to about 8° C./minute.

7. A semiconductor processing method comprising in situ forming a dopant gradient within a doped silicon layer during formation of the silicon layer in an uninterrupted deposition process, the uninterrupted deposition process comprising, during the in situ doping, varying a temperature at which the doped silicon is formed; and wherein the uninterrupted depositing begins at a temperature above or equal to about 575° C. and decreases to a temperature below or equal to about 550° C. at a rate of from about 0.5° C./minute to about 8° C./minute.

8. A semiconductor processing method comprising in situ forming a dopant gradient within a doped silicon layer during formation of the silicon layer in an uninterrupted deposition process, the uninterrupted deposition process comprising, during the in situ doping, varying a temperature at which the doped silicon is formed; wherein the temperature varies from below or equal to about 550° C. to above or equal to about 575° C. at a rate of from about 0.5° C./minute to about 8° C. minute; wherein the doped silicon comprises an essentially polycrystalline silicon region and an essentially amorphous silicon region, and further comprising:

forming a layer adjacent the doped silicon; and out-diffusing dopant from the essentially polycrystalline region and from the essentially amorphous silicon region of the doped silicon into the layer to form a dopant concentration within the layer.

9. The method of claim 8 wherein the out-diffusing into the layer forms a varying resistance within the layer.

* * * * *

UNITED STATES PATENT AND TRADEMARK OFFICE
CERTIFICATE OF CORRECTION

PATENT NO.    : 6,455,400 B1
DATED         : September 24, 2002
INVENTOR(S)   : Keith Smith et al.

It is certified that error appears in the above-identified patent and that said Letters Patent is hereby corrected as shown below:

Column 3,
Line 63, replace "0.50º C. per minute to about 80º C. per minute. The" with -- 0.5º C. per minute to about 8º C. per minute. The --

Column 5,
Line 7, replace "layer 19 is preferable doped with a conductivity-enhancing" with
-- layer 19 is preferably doped with a conductivity-enhancing --

Column 7,
Lines 4 and 5, replace "Angstroms thick: and wherein the silicon layer is formed within an opening in an insulative material." with -- Angstroms thick. --

Column 8,
Line 19, replace "to about 8º C. minute; wherein the doped silicon comprises" with -- to about 8º C./minute; wherein the doped silicon comprises --

Signed and Sealed this

Twenty-ninth Day of July, 2003

JAMES E. ROGAN
*Director of the United States Patent and Trademark Office*